Figure 1A:
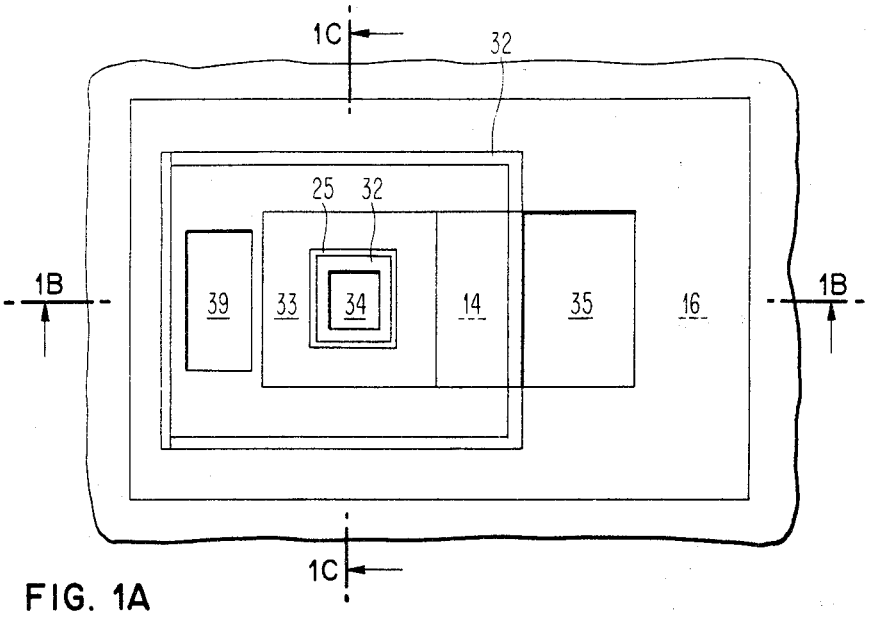
Figure 1B:
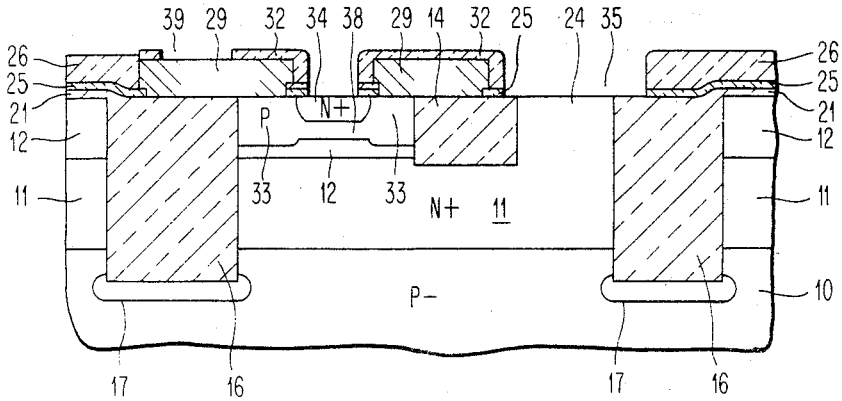
Figure 1C:
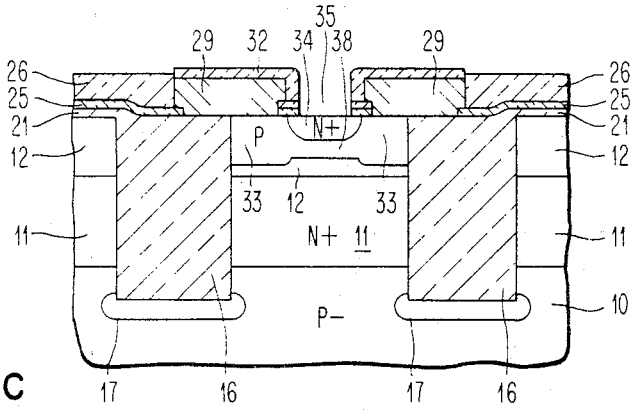
Figure 2:
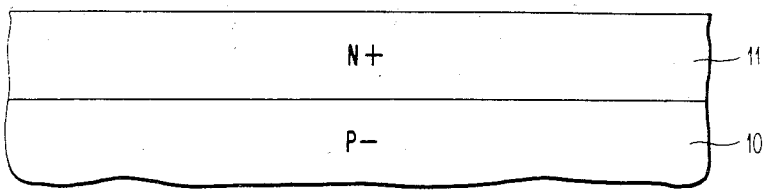
Figure 3:
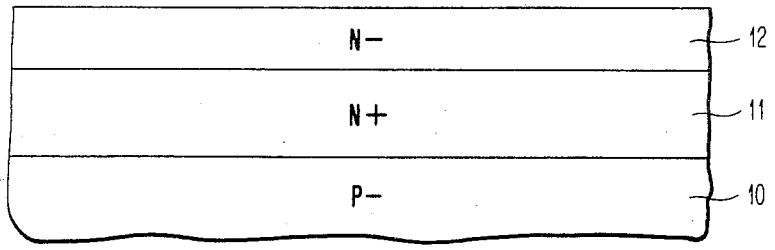
Figure 4:
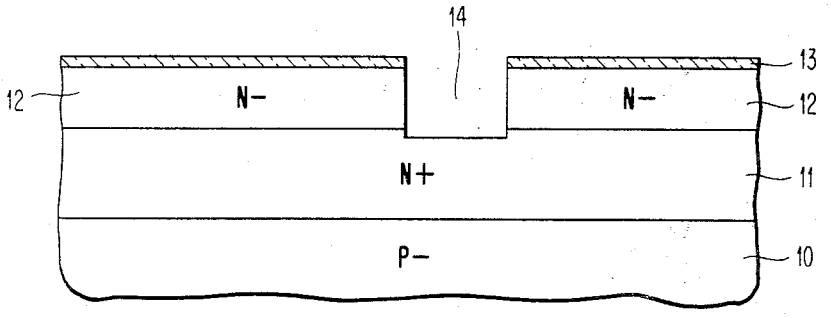
Figure 5:
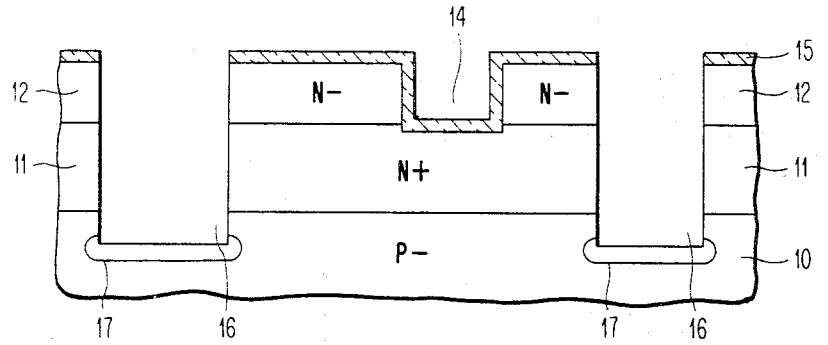
Figure 6:
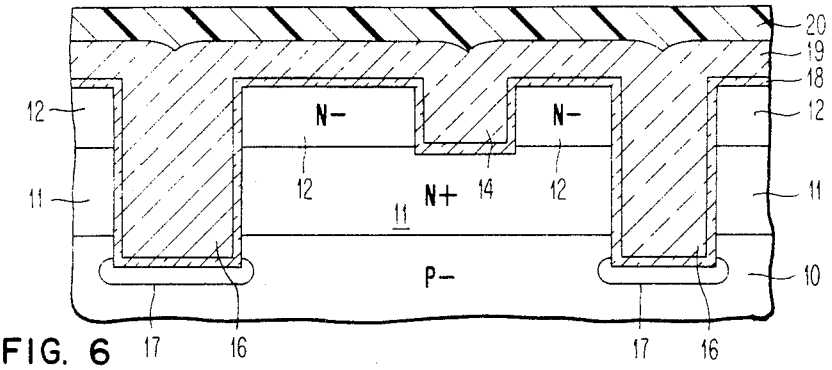
Figure 7:
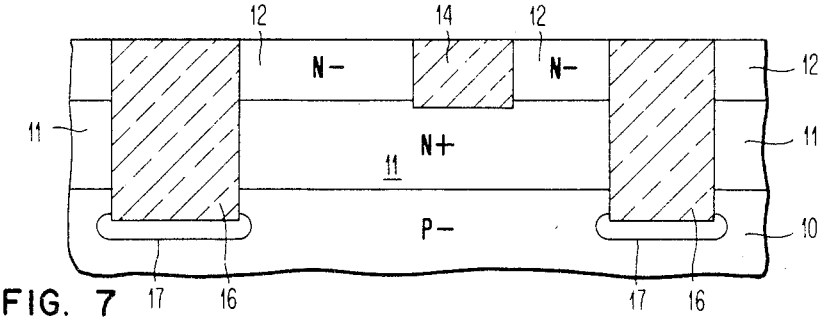
Figure 8:
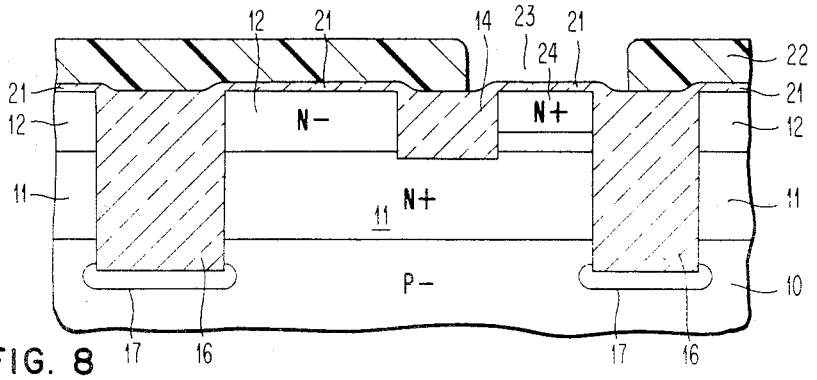
Figure 9:
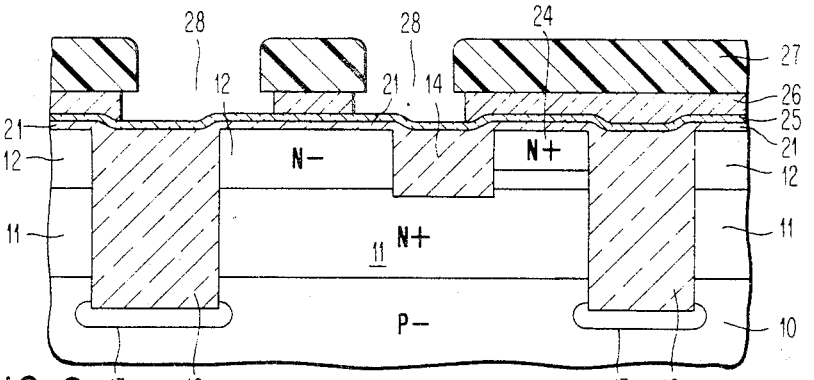
Figure 10:
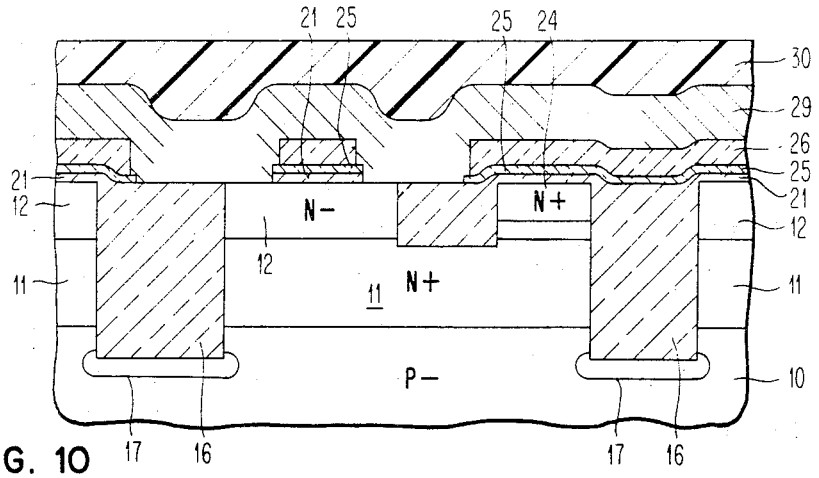
Figure 11:
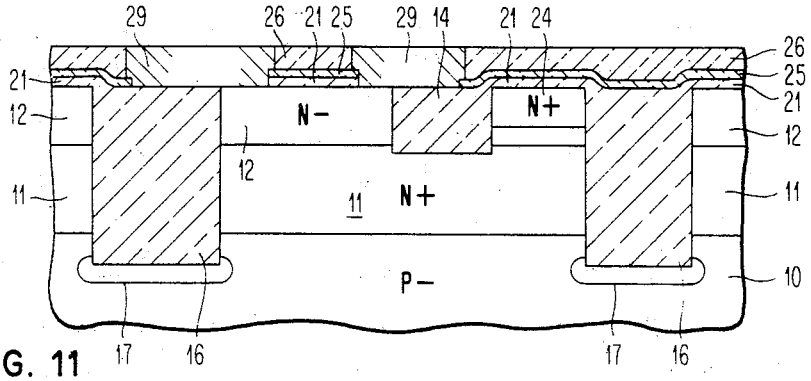
Figure 12:
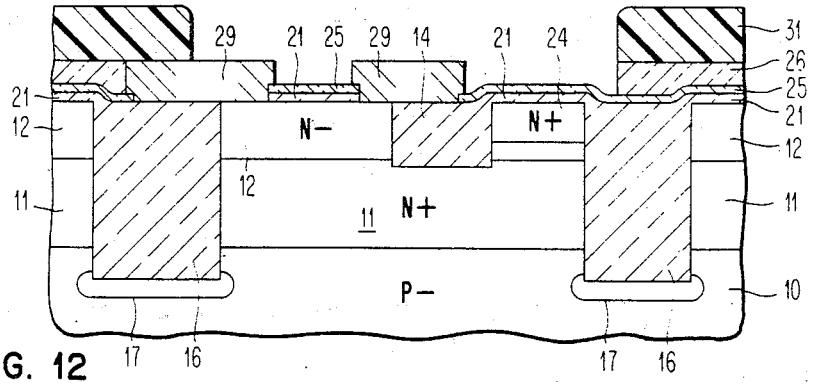
Figure 13:
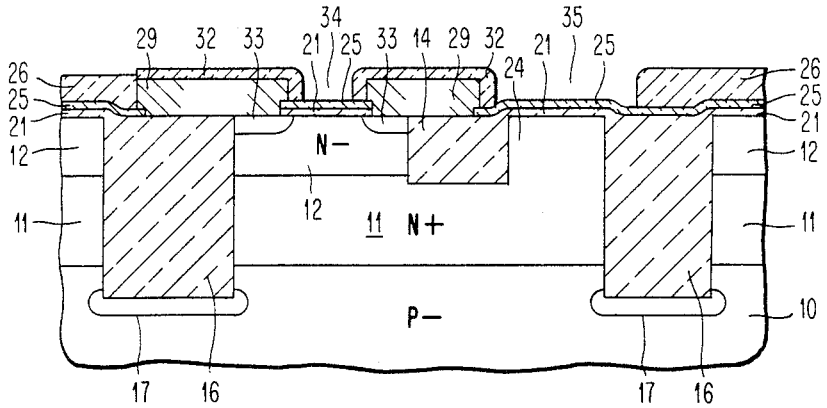
Figure 14:
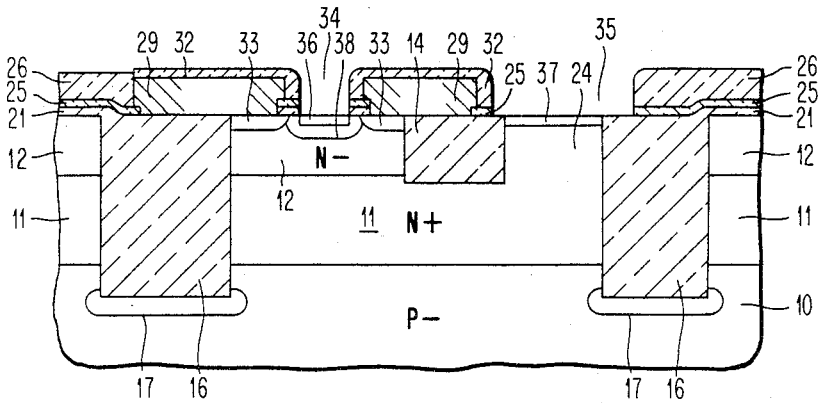
Figure 15:
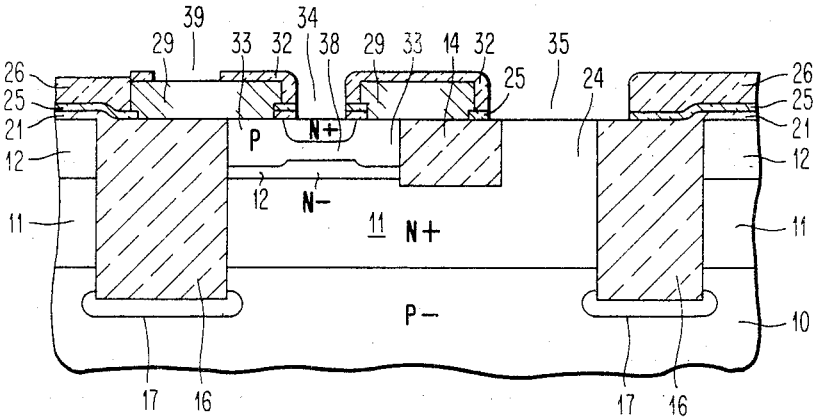

United States Defensive Publication [19] (H) [11] T104,803

Horng [43] Nov. 6, 1984

[54] SELF-ALIGNED PROCESS FOR PROVIDING AN IMPROVED HIGH PERFORMANCE BIPOLAR TRANSISTOR

[76] Inventor: Cheng T. Horng, 6396 Gondola Way, San Jose, Calif. 95120

[21] Appl. No.: 580,962

[22] Filed: Feb. 16, 1984

Related U.S. Application Data

[63] Continuation of Ser. No. 282,365, Jul. 13, 1981, abandoned.

[51] Int. Cl.[3] ..... H01L 29/72; H01L 27/04; H01L 29/06

[52] U.S. Cl. ..... 357/34; 357/50; 357/55; 357/59

[57] ABSTRACT

A bipolar transistor structure formed in a monolithic silicon semiconductor substrate of p type having a planar surface comprising: a subcollector of n type formed in the substrate; an epitaxial layer of n type formed on said planar surface of said substrate and also having a planar surface, the epitaxial layer having a thickness in the order of 1.0 to 1.5 micrometers; an enclosed deep recessed oxide isolation trench enclosing a transistor structure area of the substrate and the epitaxial layer, the enclosed deep recessed oxide isolation trench having a depth extending from said planar surface of said epitaxial layer through the subcollector region; a shallow recessed oxide isolation trench, the relatively shallow recessed oxide isolation trench being wholly enclosed by the deep recessed oxide isolation trench and intersecting the deep recessed oxide isolation trench at two spaced apart points to divide said transistor structure area enclosed by the deep recessed oxide isolation trench into first and second areas, the first and second areas being electrically connected one to the other by the subcollector region;

a shallow depth emitter region formed in a limited portion of the first area of said epitaxial layer, the emitter region having a depth in the order of 0.1 micrometers;

an active base region formed beneath said emitter region in the limited portion the first area of said epitaxial layer, the active base region having a width in the order of 0.1 micrometers;

an inactive base region surrounding the emitter region and active base region, the inactive base region being wholly contained within the first area of said epitaxial layer;

an emitter-base junction contained within said first area of the epitaxial layer and extending to the surface of the epitaxial layer;

a composite layer of silicon dioxide and silicon nitride having a width of approximately 0.2 to 0.3 micrometers, the composite layer being positioned on the planar surface of the epitaxial layer over the surface juncture of said emitter-base junction, the silicon dioxide having a thickness of approximately 500Å and the silicon nitride layer having a thickness of approximately 500Å;

the second area of the epitaxial layer containing a collector reach through, the shallow recessed oxide isolation trench isolating the collector reach through from the inactive base region;

a layer of polysilicon p type on said planar surface of the epitaxial layer and in physical and electrical contact with the inactive base region, the polysilicon layer extending over a portion of said enclosed relatively deep recessed oxide isolation trench; and, a base contact physically and electrically contacting the portion of the polysilicon layer which extends over the enclosed deep recessed oxide isolation trench.

3 Claims, 5 Sheets Drawing,

34 Pages Specification

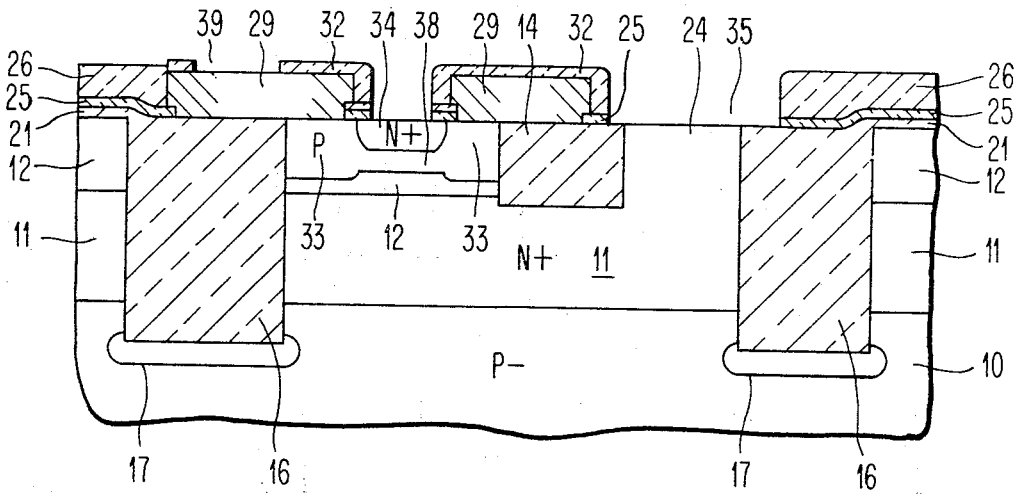

The file of this unexamined application may be inspected and copies thereof may be purchased (849 O.G. 1221, Apr. 9, 1968).